(12) United States Patent
Ono

(10) Patent No.: US 6,748,746 B2
(45) Date of Patent: Jun. 15, 2004

(54) DEVICE AND METHOD FOR CONTROLLING TEMPERATURE OF SEMICONDUCTOR MODULE

(75) Inventor: Haruyoshi Ono, Yamanashi (JP)

(73) Assignee: Fujitsu Quantum Devices Limited, Yamanashi (JP)

( * ) Notice: Subject to any disclaimer, the term of this patent is extended or adjusted under 35 U.S.C. 154(b) by 40 days.

(21) Appl. No.: 10/179,193

(22) Filed: Jun. 26, 2002

(65) Prior Publication Data

US 2003/0014980 A1 Jan. 23, 2003

(30) Foreign Application Priority Data

Jul. 18, 2001 (JP) ......................................... 2001-217729

(51) Int. Cl.[7] ............................................. F25B 21/02
(52) U.S. Cl. ........................................................ 62/3.2
(58) Field of Search ............................. 62/3.1, 3.2, 3.7

(56) References Cited

U.S. PATENT DOCUMENTS 4,848,090 A * 7/1989 Peters ........................... 62/3.3
6,293,698 B1 * 9/2001 Alvis ........................... 374/164
6,504,392 B2 * 1/2003 Fredeman et al. .......... 324/760

* cited by examiner

Primary Examiner—Henry Bennett
Assistant Examiner—Malik N. Drake
(74) Attorney, Agent, or Firm—Armstrong, Kratz, Quintos, Hanson & Brooks, LLP

(57) ABSTRACT

A device and method for controlling the temperature of a semiconductor module in which the semiconductor module is sandwiched by a first supporting unit and a second supporting unit. An area of the second supporting unit with which the semiconductor module comes into contact is shielded from heat of external ambient atmosphere, and has a temperature sensor provided thereat. The temperature of the first supporting unit is controlled so that the temperature of this area becomes equal to a predetermined temperature. The amount of heat moving from the heat-shielded area to the semiconductor module is small, so that the difference between the temperatures in the region extending from the heat-shielded area and the semiconductor module is small. The first and second supporting units may be separately controlled at different predetermined temperatures. By this, changes in the temperature of the semiconductor module caused by changes in outside air temperature are reduced. The invention aims at making the difference between the temperature of the semiconductor module and a predetermined temperature small when controlling the temperature of the semiconductor module by bringing it into contact with the supporting units whose temperatures have been controlled.

12 Claims, 5 Drawing Sheets

PRIOR ART

DEVICE AND METHOD FOR CONTROLLING TEMPERATURE OF SEMICONDUCTOR MODULE

BACKGROUND OF THE INVENTION

1. Field of the Invention

The present invention relates to a device for controlling the temperature of a semiconductor module and a method of controlling the temperature of a semiconductor module. More particularly, the present invention relates to a device and a method for precisely controlling the temperature of a semiconductor module, which is a test sample on which an environmental temperature test is performed, to a test temperature.

A semiconductor module, such as an optical module having an optical semiconductor element, such as a laser, mounted therein is widely used as a key component of a high-speed communication network as typified by the internet. Among semiconductor modules, the demand for a small coolerless module for intermediate-distance optical communication is increasing.

Such semiconductor modules are often used in locations where high reliability is required of them as in a submarine repeater, or in locations where the temperature environment is severe such as outdoors, so that they are subjected to strict environmental temperature tests to guarantee their reliability.

In environmental temperature tests, the temperatures of semiconductor modules are changed in accordance with a predetermined temperature sequence, during which optical input/output characteristics are observed. Based on the temperature dependencies of the observed semiconductor modules, it is determined whether these observed semiconductor modules are good or defective modules. Therefore, in order to precisely measure the temperature dependencies, it is necessary to precisely control the temperatures of the semiconductor modules.

2. Description of the Related Art

Hitherto, in an environmental temperature test of a semiconductor module, such as an optical module, the temperature of the semiconductor module is kept at the test temperature by placing the semiconductor module on an temperature equalizing block controlled to a test temperature. Hereunder, a related test device will be described.

FIG. 1 is a side view of a related device used for an environmental temperature test of a semiconductor module. Referring to FIG. 1, in the related test device, a heat exchanger 53, a Peltier element 51, and an temperature equalizing block 52 are placed upon each other in that order on a device base 50 in contact with each other. The Peltier element 51 varies the temperature of the temperature equalizing block 52 by absorbing or discharging heat from the temperature equalizing block 52 which is placed in contact with the top surface of the Peltier element 51. The temperature of the temperature equalizing block 52 is detected by a platinum resistance temperature sensor 54 placed inside a hollow near the top surface of the temperature equalizing block 52. The Peltier element is driven so that the detected temperature of the temperature equalizing block 52 is equal to the test temperature, that is, an environmental temperature specified in a test specification.

In a semiconductor module 10, a semiconductor laser element, a built-in Peltier element for controlling the temperature of the semiconductor laser element, and an optical part (none of which are shown) are incorporated in a package 13 including a heat-dissipating plate 12, disposed at the lower portion of the semiconductor module 10, and a cover 11 that covers the heat-dissipating plate 12. In the semiconductor module 10, which is a test sample on which an environmental temperature test is conducted, the bottom surface of the heat-dissipating plate 12 is placed in close contact with the top surface of the temperature equalizing block 52, so that, by conduction of heat from the top surface of the temperature equalizing block 52, the temperature of the semiconductor module 10 is kept equal to the temperature of the temperature equalizing block 52. With the temperatures being kept equal to each other, characteristics of the semiconductor module, such as the light input/output characteristics, are measured.

In the above-described related environmental temperature test device, the temperature of the temperature equalizing block 52 is controlled at a predetermined temperature specified in the test specification. By placing the semiconductor module 10, which is a test sample, on the temperature equalizing block 52, the temperature of the semiconductor module 10 is caused to reach the predetermined temperature of the temperature equalizing block.

However, since the semiconductor module 10 is only placed on the temperature equalizing block 52, heat resistance between the semiconductor module 10 and the temperature equalizing block 52 tends to become large due to contact failure. Considering heat dissipation, the top surface of the semiconductor module 10 (that is, the surface opposite to the surface that contacts the temperature equalizing block 52) is ordinarily designed so that the heat resistance with the ambient atmosphere is small. As a result, a large amount of heat dissipation from the top surface of the semiconductor module 10 causes a large temperature difference to occur due to the heat resistance between the temperature equalizing block 52 and the semiconductor module 10. Therefore, the temperature of the semiconductor module 10 is different by that amount of temperature difference from the predetermined temperature being specified in the test specification. In an ordinary specification of the environmental temperature test, the test temperature is set at the surface temperature of the semiconductor module 10. In such a case, the difference between the temperatures of the temperature equalizing block 52 and the semiconductor module 10 cannot be ignored because it causes a reduction in the accuracy of the test temperature of the environmental temperature test.

To prevent such a temperature difference, an attempt has been made to carry out a method of monitoring the temperature of the semiconductor module 10 using a temperature sensor, such as a thermistor, which is attached to a surface of the semiconductor module 10. However, in this method, the temperature distribution in the semiconductor module varies due to a considerable change in the heat transfer coefficient at the portion to which the temperature sensor is attached, consequently the temperature of the semiconductor module 10 cannot be precisely measured.

In addition, the semiconductor module 10 incorporates elements, including the semiconductor laser element and the Peltier element, which generate or absorb a large amount of heat. The generation and absorption of heat by these elements change the temperature distribution of a portion of the test device that contacts the semiconductor module 10, such as the temperature distribution near the top surface of the temperature equalizing block 52. The temperature sensor 54 of the temperature equalizing block 52 is not necessarily provided at a location where it can precisely detect this temperature distribution. Therefore, it becomes more difficult to precisely measure and control the surface temperature of the semiconductor module.

Another problem with the above-described related environmental temperature test device is that there is difficulty in controlling the temperature of the semiconductor module near room temperature.

Environmental temperature tests usually need to be carried out at ordinary temperatures. This ordinary temperature is generally specified as a temperature near 25 degrees, so that there are cases where there is very little difference between the ordinary temperature and the room temperature. In this case, the difference between the temperature of the temperature equalizing block 52 kept at ordinary temperature and the temperature of the ambient atmosphere at room temperature is small, consequently it is difficult to control the temperature. In addition, changes in the temperature of the ambient atmosphere surrounding the semiconductor package immediately changes the temperature of the surface of the semiconductor package. Accordingly, it is very difficult to stably maintain the temperature of the semiconductor package at an ordinary temperature near a room temperature.

As described above, in the related device for controlling the temperature of a semiconductor module used in the environmental temperature test, by placing the semiconductor module on the temperature equalizing block controlled at the test temperature, the temperature of the semiconductor module is caused to reach the test temperature. However, there is a problem that the temperature of the semiconductor module is difficult to be controlled precisely, since a temperature difference occurs due to heat resistance between the temperature equalizing block and the semiconductor module.

When the control temperature is near room temperature, it is difficult to control the temperature of the semiconductor module, since the difference between the temperatures of the semiconductor module and the temperature of the ambient atmosphere is small. In addition, there is another problem that a fluctuation in the room temperature directly leads to large change of the temperature of the semiconductor module.

SUMMARY OF THE INVENTION

It is an object of the present invention to provide a device and method for controlling temperature, which make it possible to precisely control the temperature of a semiconductor module to a predetermined temperature.

It is another object of the present invention to provide a device and method for controlling the temperature of a semiconductor module, which make it possible to precisely control the temperature of the semiconductor module near ordinary temperature and which are unaffected by changes in the temperature of ambient atmosphere.

FIG. 2 is a side view of an assembly of a first embodiment of the present invention, showing the structure of supporting units of a semiconductor module. FIG. 3 is a sectional view of the first embodiment of the present invention, showing a state in which the semiconductor module, mounted to a socket, is supported by the supporting units.

Referring to FIGS. 2 and 3, in a first structure of the present invention, a first heat transfer surface 25 of a first supporting unit 20 and a second heat transfer surface 31 of a second supporting unit 30 contact different portions, such as the top and bottom surfaces, of a semiconductor module 10, respectively. Through both of the heat transfer surfaces 25 and 31, heat is exchanged between the first and second supporting units 20 and 30 and the semiconductor module 10, respectively.

The second supporting unit 30 further includes a temperature sensor 34 and a heat insulating section 33. The heat insulating section 33 is provided near an area including the second heat transfer surface 31 and the temperature sensor 34, and limits heat flow to that from only the second heat transfer surface 31 with regard to heat flowing into and out of this area. This limiting operation is not limited to the case where, with regard to the flowing-in and flowing-out of heat of the area, heat flow from portions other than the second heat transfer surface is nearly blocked. For example, this operation may be more or less limited heat flow into and out of this area from the portions other than the second heat transfer surface.

In the first structure, the temperature of the first supporting unit 20 is cotrolled so that the temperature measured by the temperature sensor 34, which measures the temperature of the area of the second supporting unit 30 insulated by the heat insulating section 33, is equal to a predetermined temperature which is a control target temperature. Here, the temperature of the first supporting unit 20 is not controlled so that it equals a previously determined temperature. The temperature of the second supporting unit 30 measured by the temperature sensor 34 is controlled so that it equals the target temperature.

When the temperature of the first supporting unit 20 is lower than that of the second supporting unit 30, heat flows into the semiconductor module 10 from the second heat transfer surface 31 through a portion of the semiconductor module 10 that contacts the second heat transfer surface 31. From another portion of the semiconductor module 10, the heat flows into the first supporting unit 20 through the first heat transfer surface 25 that contacts this another portion. On the other hand, when the temperature of the first supporting unit 20 is higher than that of the second supporting unit 30, heat flows in the opposite direction. Therefore, based on the heat resistances between the first and second heat transfer surfaces 25 and 31 and the semiconductor module 10, a temperature difference occurs between the first and second supporting units 20 and 30 and the semiconductor module 10 in proportion to the amount of heat flow through these heat transfer surfaces 25 and 31.

In the above-described first structure of the present invention, the area of the second supporting unit 30, in which the temperature sensor 34 and the second heat transfer surface 31 are disposed, is shielded thermally by the heat insulating section 33. Therefore the amount of heat flowing into and out of this area is small. The amount of heat flowing through the second heat transfer surface 31 is equal to the sum of the amount of heat required to make the temperature of this area equal to the target temperature and the amount of heat flowing into and out of this area through the periphery of this area except the second heat transfer surface 31. In the structure, since the amount of heat flowing into and out of this area through the periphery of this area except the second heat transfer surface 31 is small, the amount of heat flowing through the second heat transfer surface 31 is small. As a result the difference between the temperature of the second supporting unit 30 (more exactly the area including therein the second heat transfer surface 31 and the temperature sensor 34) and the temperature of the semiconductor module 10 is small. Therefore, the temperature of the semiconductor module 10 can be made nearly equal to the temperature of the second supporting unit 30 with a slight temperature difference. The temperature of the second supporting unit 30 is measured by the temperature sensor 34 and is controlled based on the measurement result, and is, thus, maintained precisely at the predetermined temperature. Consequently, the temperature of the semiconductor module 10 is controlled so as to be almost equal to the predetermined temperature with a slight temperature difference.

When heat is generated from the inside of the semiconductor module 10, the generated heat raises the temperature of the semiconductor module 10 and then raises a temperature of a portion of the second supporting unit 30 near the second heat transfer surface 31. This temperature rise is immediately detected by the temperature sensor 34 disposed near the second heat transfer surface 31 and is corrected. This correction is achieved by increasing the amount of heat flowing into the first supporting unit 20 from the semiconductor module 10 through the first heat transfer surface 25 by lowering the temperature of the first supporting unit 20. Therefore, the generated heat in the semiconductor module 10 is absorbed mainly as a result of an increase or decrease in the temperature difference between the first heat transfer surface 25 and the semiconductor module 10, so that the amount of heat flowing through the second heat transfer surface 31 does not vary significantly. For this reason, the difference between the temperatures of the second supporting unit 30 and the semiconductor module 10 varies little, thereby making it possible to precisely control the temperature of the semiconductor module 10 that generates heat.

The area where heat is blocked may be limited to a small portion of the second supporting unit 30 so as to reduce the heat capacity of this area. By this limitation it is possible to sensitively detect a change of the temperature of the semiconductor module 10. In addition, the heat insulating section 33, provided at the second supporting unit 30, increases the heat resistance between the second supporting unit 30 and the external environment, such as indoor ambient atmosphere. Therefore, the change of the temperature of the external environment does not substantially influence on the controlling operation of the temperature of the semiconductor module 10.

FIG. 5 is a sectional view of an assembly of a second embodiment of the present invention, showing supporting units of a semiconductor module.

Referring to FIG. 5, a temperature regulator 36 for raising and lowering the temperature of a second supporting unit 30 may be provided in place of the heat insulating section 33 of the above-described first structure in the present invention. The temperature regulator 36 is driven so that the temperature of the second supporting unit 30 is maintained nearly at a control target temperature or becomes at least close to the control a target temperature. This driving operation may be performed to control the temperature of a portion of the second supporting unit 30 other than the area including the temperature sensor 34 at a previously determined temperature, or to generate or absorb heat in the second supporting unit 30 according to a predetermined sequence. In this structure, since the difference between the temperatures of the area including the temperature sensor 34 and portions near this area is small, the amount of heat flowing into and out of the area is small, thereby making it possible to provide similar advantages to those provided when the heat insulating section 33 is disposed.

Referring to FIG. 5, in a second structure of the present invention, similarly to the already mentioned first structure, a first heat transfer surface 25 disposed on a first supporting unit 20 and a second heat transfer surface 31 disposed on a second supporting unit 30 contact different portions of a semiconductor module 10, respectively, so that heat is exchanged between the supporting units 20 and 30 and the semiconductor module 10 through both of the heat transfer surfaces 25 and 31.

In the second structure, the temperatures of the first and second supporting units 20 and 30 are each controlled at different predetermined temperatures. Heat flows through the semiconductor module 10 based on the temperature difference between the first and second supporting units 20 and 30. During the temperature test, the temperatures of both of the supporting units 20 and 30 are maintained at certain temperatures so that the heat flow is steady. When the heat flow is steady, the amount of heat flowing through both of the heat transfer surfaces 25 and 31 is constant. Therefore, the difference between the temperatures of the semiconductor module 10 and both supporting units 20 and 30 does not change with time, and, thus, becomes constant. As a result, the temperature of the semiconductor module 10 is maintained at a constant temperature intermediate between those of the first and second supporting units 20 and 30. For the case where the predetermined temperatures of the supporting units 20 and 30 change in a quasi-steady manner in accordance with the temperature sequence, a similar argument can be made.

The temperature of the semiconductor module 10 in the second structure is determined by the temperatures of the first and second supporting units 20 and 30 and the heat resistances between the semiconductor module 10 and the first and second heat transfer surfaces 25 and 31. The heat resistances between the semiconductor module 10 and the first and second heat transfer surfaces 25 and 31 is constant after the semiconductor module 10 has been mounted to the supporting units 20 and 30, so that it does not change with the passage of time and with changes of the temperatures of the supporting units 20 and 30 with. Therefore, when the heat resistances of the two heat transfer surfaces 25 and 31 or the ratio between the heat resistances is previously known, it is possible to set the temperatures of the first and second supporting units 20 and 30 so that the temperature of the semiconductor module 10 is set at a predetermined temperature. In other words, the temperature of the semiconductor module 10 can be made exactly equal to the predetermined temperature. The heat resistances can be known by, for example, measuring the temperature of the semiconductor module 10, and comparing it with the temperatures of the supporting units 20 and 30.

The temperatures of the first and second supporting units 20 and 30 that can maintain the temperature of the semiconductor module 10 at the predetermined temperature are not limited to one value set. For example, the temperature of the semiconductor module 10 can be maintained at the predetermined temperature by making the temperature of one of the supporting units higher and that of the other supporting unit lower. Therefore, it is possible to control the temperature of the semiconductor module 10 to the predetermined temperature under the condition of large temperature difference existing between the first and second supporting units 20 and 30. By making the difference between the temperatures of the supporting units 20 and 30 large as mentioned above, the amount of heat flowing through the heat transfer surfaces 25 and 31 is made large, so that stability of the temperature control can be enhanced. When the predetermined temperature is close to room temperature, since the difference between room temperature and the temperatures of the supporting units 20 and 30 to be subjected to temperature control can be made large, the temperatures of the supporting units 20 and 30 is also stably controlled. When the amount of heat flowing through the heat transfer surfaces 25 and 31 is large, the temperature of the semiconductor module 10 is always precisely controlled to the predetermined temperature in accordance with the ratio between the heat resistances regardless of the temperature difference between the semiconductor module 10 and the heat transfer surfaces 25 and 31.

In the above-described second structure of the present invention, when the amount of heat generated in the semiconductor module 10 is constant, the temperature of the semiconductor module 10 can be exactly controlled to the predetermined temperature by considering that the temperature of the semiconductor module 10 increases by the corresponding rise in temperature of the semiconductor module 10 due to the heat generation. Even when the amount of generated heat changes (for example, even when the amount of generated heat depends upon the temperature of the semiconductor module 10), if the rise in temperature by the heat generation can be known, it is possible to know the exact temperature by correction. However, when the amount of generated heat changes, it is usually difficult to know the amount of rise in temperature. In such a case, the large temperature difference between the supporting units 20 and 30 increases the amount of heat flowing through the heat transfer surfaces 25 and 31, so that the ratio of the change of the heat flow amount due to the heat generation in the semiconductor module 10 is made small. As a result, it is possible to reduce the influence of the heat generation in the semiconductor module.

A third structure of the present invention relates to a method of controlling temperature by heat exchange with a semiconductor module through a plurality of heat transfer surfaces. The method of controlling temperature relates to the above-described second structure of the present invention corresponds to the case where two heat transfer surfaces are used in the third structure.

In the third structure, the temperatures of the plurality of heat transfer surfaces are controlled at predetermined temperatures respectively, and the temperature of at least one of the plurality of heat transfer surfaces is controlled at a temperature that is different from the temperatures of the other heat transfer surfaces. Therefore, as in the description of the second structure of the present invention, temperature control can be carried out so that the temperature of the semiconductor module, which contacts these heat transfer surfaces, is equal to a predetermined temperature. The third structure provides operations and advantages that are substantially the same as those provided by the second structure of the invention, such as that stable temperature control is achieved, and that the effects of, for example, room temperature are small.

In the above-described first and second structures, the semiconductor module 10 may be interposed between the heat transfer surfaces 25 and 31 disposed so as to oppose each other. By interposing the semiconductor module 10, the heat transfer surfaces 25 and 31 can be pressed against the semiconductor module 10, so that heat resistances therebetween can be made small.

In the first and second structures, by using a specially constructed supporting unit and a socket, it is possible to control the temperature of the semiconductor module with the semiconductor module being mounted to the socket. Hereunder, a description of the supporting unit and the socket will be given.

With reference to FIGS. 4A and 4B, a socket 40 for mounting the semiconductor module 10 thereto has a through hole 42 formed in the center of a socket base 41. A head section 32 is provided so as to protrude from the supporting unit, with an end of the head section 32 being a heat transfer surface 31. The head section 32 is fitted through the through hole 42, so that the heat transfer surface 31 protrudes from the socket base 41. The protruding heat transfer surface 31 contacts the surface of the semiconductor module 10 mounted to the socket base 41. By using the supporting unit and the socket, the temperature controlling devices in accordance with the already described first and second structures of the present invention can be applied with the semiconductor module being mounted to the socket. The head section 32 that is fitted through the through hole 42 of the socket 40 may be provided in either of the first and second supporting units 20 and 30.

In a fourth structure of the present invention, a first unit for controlling the temperature of a semiconductor module and a second unit for measuring the temperature of the semiconductor module are disposed apart from each other as separate units. For the semiconductor module, a portion suitable for controlling temperature and a portion suitable for measuring temperature are sometimes different. In this structure, these portions can be separately thermally connected.

Since the inside of the semiconductor module is not homogeneous, even if an attempt is made to change the temperature of the semiconductor module by desired temperature, the rate of changes in temperature of the semiconductor module (changes in temperature per unit time) is sometimes different from the rate of changes in temperature of the first unit for controlling temperature. According to this structure, the temperature of the first unit for controlling temperature is not measured. The second unit that thermally contacts the semiconductor module separately of the first unit is used to measure the temperature of the semiconductor module, so that the rate of changes in temperature of the semiconductor package can be more precisely obtained than that when the temperature of the first unit is measured.

DESCRIPTION OF THE PREFERRED EMBODIMENTS

The first embodiment of the present invention relates to a device for controlling the temperature of a semiconductor module. The device is related to the first structure of the present invention used in an environmental temperature test for an optical module.

Figure 1:
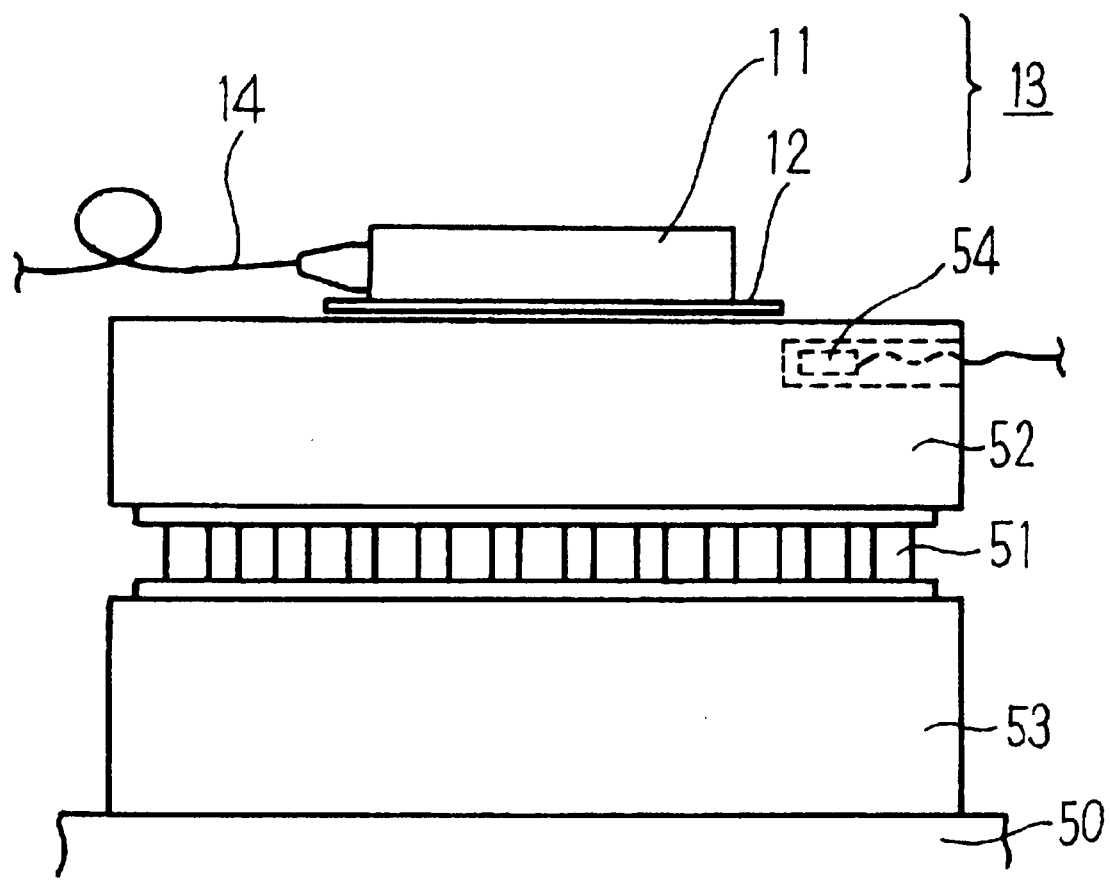
FIG. 1 is a side view of a related example.
Figure 2:
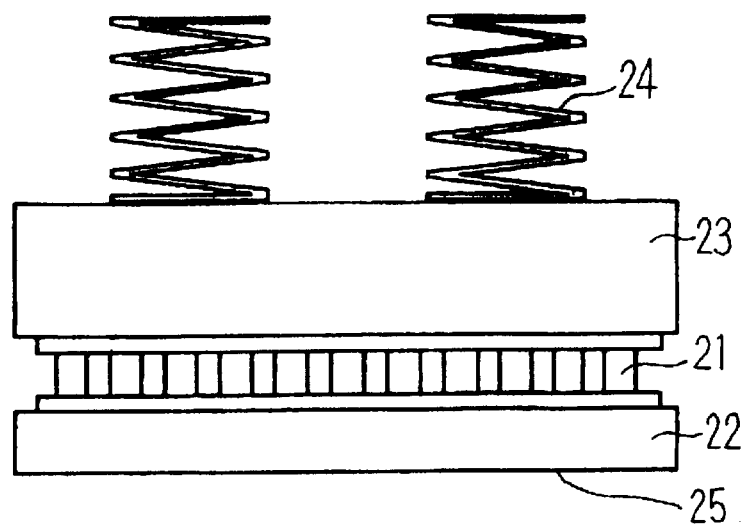
FIG. 2 is a side view of an assembly of a first embodiment of the present invention.
Figure 2:
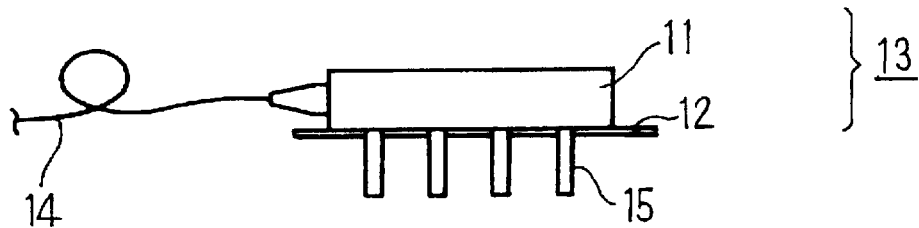
Figure 2:
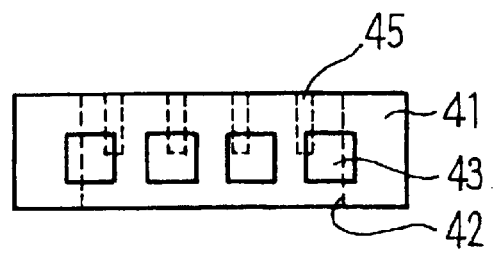
Figure 2:
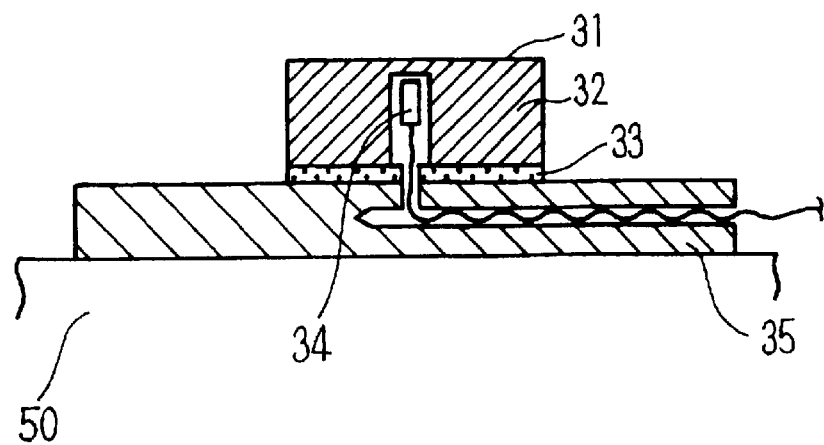

First, a description of a semiconductor module, which is a test sample on which the environmental temperature test is conducted, will be described. Referring to FIG. 2, a semiconductor module 10 in the embodiment is an optical module incorporating a semiconductor laser element (not shown), and includes a package 13. The package 13 includes a heat-dissipating plate 12, which forms the bottom surface of the optical module and which serves as a mounting attachment, and a cover 11 for covering the top surface of the heat-dissipating plate 12 as a box does. Inside the package 13, an optical part and a Peltier element for controlling the temperature of the laser element, neither of which is shown, are provided on the heat-dissipating plate 12, with the semiconductor laser element (not shown) being placed on the Peltier element. DIP (dual in-line package) lead pins 15 are provided in a row on both side surfaces of the package 13, and an optical fiber 14 is drawn out from an end of the package 13.

Figure 4A:
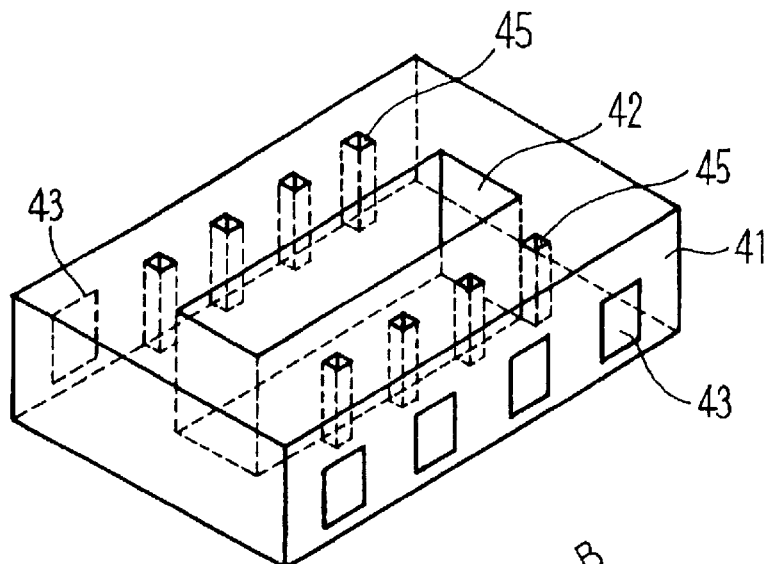
FIGS. 4A to 4C are perspective views of the first embodiment of the present invention.

The semiconductor module 10 is subjected to the environmental temperature test by being mounted to the socket 40 serving as a jig of the temperature controlling device. Referring to FIG. 4A, two rows of pin holes 45 for inserting the pins 15 of the semiconductor module 10 therethrough are formed, one row each at the left and right sides of the top surface of the socket base 41. Pads 43 are provided on both side surfaces of the socket base 41 in correspondence with each of the pin holes 45. In FIG. 4A, some of the pads 43 are not shown. Contactors (not shown) for electrical connection with the pins 15 are provided at the pin holes 45. Using an internal wiring, the contactors are electrically connected to their corresponding pads 45. The pads 43 are used to electrically connect the semiconductor module 10 and devices like measuring devices during the environmental temperature test.

Figure 4B:
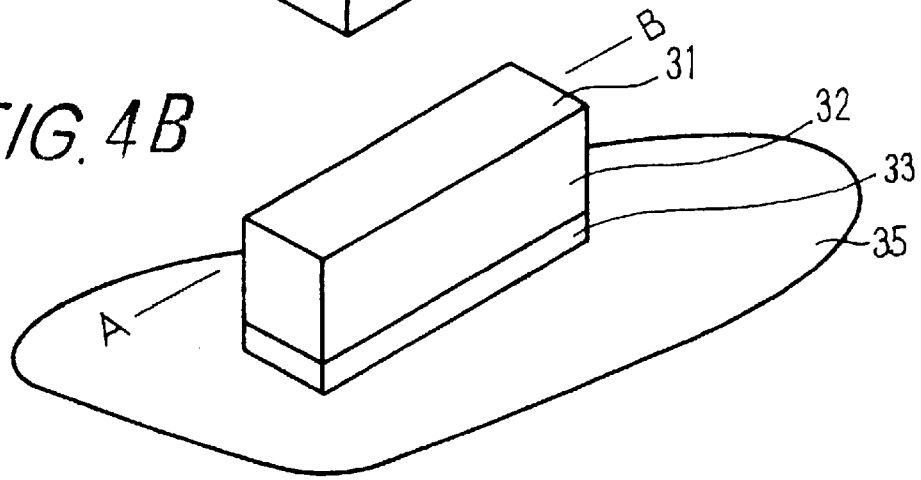

In the socket 40, a through hole 42 is formed in the central portion of the socket base 41. Referring to FIG. 4B, the through hole 42 is formed with a shape in accordance with the shape of a head section 32 so that the head section 32, provided so as to protrude from the supporting unit 30, is fitted through the through hole 42. It is desirable that the through hole 42 be provided at a location where the top surface (heat transfer surface 31) of the head section 32, fitted through the through hole 42, contacts a high-heat-transfer-coefficient portion of the surface of the semiconductor module 10. In addition, it is desirable for the area of the through hole 42 to be large from the viewpoint of making the top surface, that is, the heat transfer surface 31 of the head section 32 large. The formation of the through hole 42 is not limited to the case where it is completely formed in the inside portion of the socket base 41, so that a portion thereof may appear at a side surface of the socket base 41.

Figure 3:
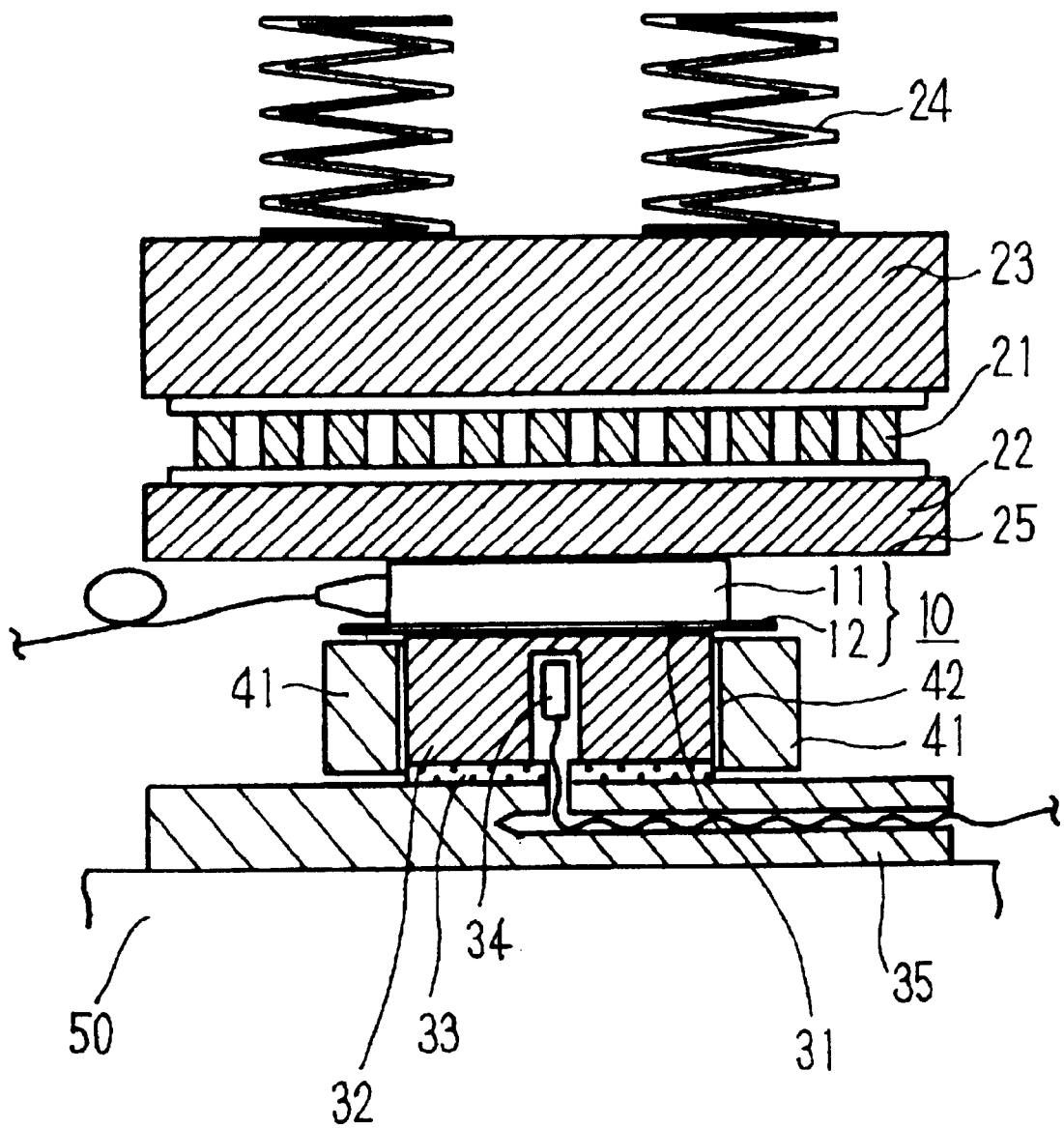
FIG. 3 is a sectional view of the first embodiment of the present invention.

Referring to FIGS. 2 and 3, the environmental temperature test is conducted with the semiconductor module 10, mounted to the socket 40, being sandwiched by supporting units 20 and 30 from above and below the semiconductor module 10.

Figure 4C:
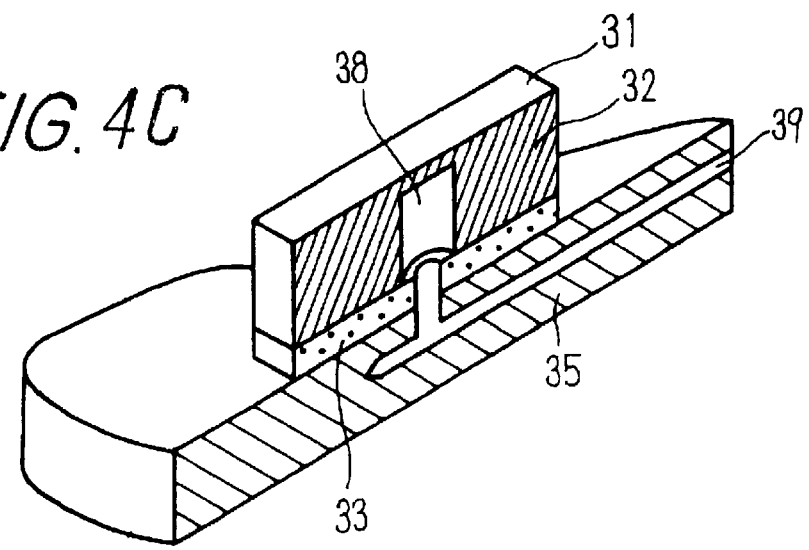

Referring to FIGS. 2, 3, and 4, in the lower supporting unit 30, which forms the temperature controlling device, the head section 32, formed of a material which conducts heat well (such as copper) and having a rectangular parallelepiped shape, is provided on the top surface of a unit support 35, serving as a base of the supporting unit 30, by interposing an heat insulating section 33 (which is a layer of heat insulating material) between the top surface of the unit support 35 and the head section 32. The head section 32 is loosely fitted and passed through the through hole 42 of the socket 40, so that the top surface of the head section 32 protrudes from the top surface of the socket base 41. The top surface of the head section 32 is formed as a flat head transfer surface 31, and is in close contact with the bottom surface of the heat-dissipating plate 12 of the semiconductor module 10 sandwiched by the supporting units 20 and 30. A hollow 38 is formed in the head section 32 from the bottom surface thereof, with a platinum resistance temperature sensor 34 being attached to the inside portion of the head section 32. The lower supporting unit 30 is installed on a device base 50 of the temperature test device serving as a heat sink.

The upper supporting unit 20, which forms the temperature controlling device, includes an temperature equalizing block 22 which is in close contact with the bottom surface of a temperature regulator 21, comprising a Peltier element, and which is formed of a material which conducts heat well. The temperature regulator 21 varies the temperature of the temperature equalizing block 22 by discharging or absorbing heat being transferred towards the temperature equalizing block 22. A heat exchanger 23 is provided on the top surface of the temperature regulator 21, and processes waste heat and absorbed heat of the temperature regulator 21. For the heat exchanger 23, for example, an air cooling type or a liquid cooling type may be used. The bottom surface of the temperature equalizing block 22 is formed as a flat heat transfer surface 25. Springs 24 are provided above the heat exchanger 23, and push down the temperature equalizing block 22, the temperature regulator 21, and the heat exchanger 23. By this, the heat transfer surface 25 pushes down on and is brought into close contact with the top surface of the package 13 of the semiconductor module 10. From the view point of more closely contacting the heat transfer surface 25 and the package 13, the larger the pushing forces of the springs 24, the better. Therefore, the pushing forces of the springs 24 are made large within a range allowed by the strength of the package 13. In this embodiment, the pushing force is set at a value that is automatically selected in accordance with the material of the package. The strength of the package 13 is ordinarily virtually determined based on the package material. Therefore, by setting the pushing force in accordance with the package material, a proper pushing force can be easily obtained.

Next, a description of controlling the temperature of the semiconductor module in the environmental temperature test will be given. Referring to FIG. 2, the pins 15 of the semiconductor module 10 is inserted into the pin holes 45 of the socket 40 in order to mount the semiconductor module 10 onto the socket base 41. Next, referring to FIG. 3, the head section 32 of the lower supporting unit 30 is passed through the through hole 42 of the socket base 41 in order to mount the socket 40 onto the supporting unit 30 so that the top surface, that is, the heat transfer surface 31 of the head section 32 is in close contact with the bottom surface of the heat-dissipating plate 12 of the semiconductor module 10. Here, the semiconductor module 10 and the socket 40 are held so that the heat-dissipating plate 12 is placed and supported on the heat transfer surface 31.

Then, the upper supporting unit 20 moves down from above the semiconductor module 10, so that the bottom surface, that is, the heat transfer surface 25 of the temperature equalizing block 22 comes into close contact with and pushes down on the top surface of the package 13 of the semiconductor module 10. Therefore, the semiconductor module 10 is supported by being sandwiched between the heat transfer surfaces 25 and 31 of the corresponding supporting units 20 and 30 from above and below the semiconductor module 10. Here, the plurality of springs 24 are used for pushing down on the package 13. By this, even if the top surface of the package 13 is tilted from the horizontal direction, the heat transfer surface 25 tilts along and is in close contact with the top surface of the package 13.

Next, a probe (not shown), which is an electrically measuring instrument, is brought into contact with the pads 43 at the side surfaces of the socket base 41 in order to electrically connect it with the semiconductor module 10. The optical fiber 14 is connected to an optical measuring device (not shown), such as a light intensity measuring device or a light wavelength measuring device.

Next, the semiconductor module 10 is driven to start optical measurements. Thereafter, temperature control of the semiconductor module 10 is started in accordance with a temperature sequence set for test use. In this temperature control, control electrical power to the temperature regulator 21 of the upper supporting unit 20 is adjusted in order to control the temperature of the head section 32 of the lower supporting unit 30 measured by the temperature sensor 34 so as to be equal to a predetermined temperature determined by the specified temperature sequence. By this, the temperature of the semiconductor module 10 is precisely controlled at a predetermined temperature value.

Figure 5:
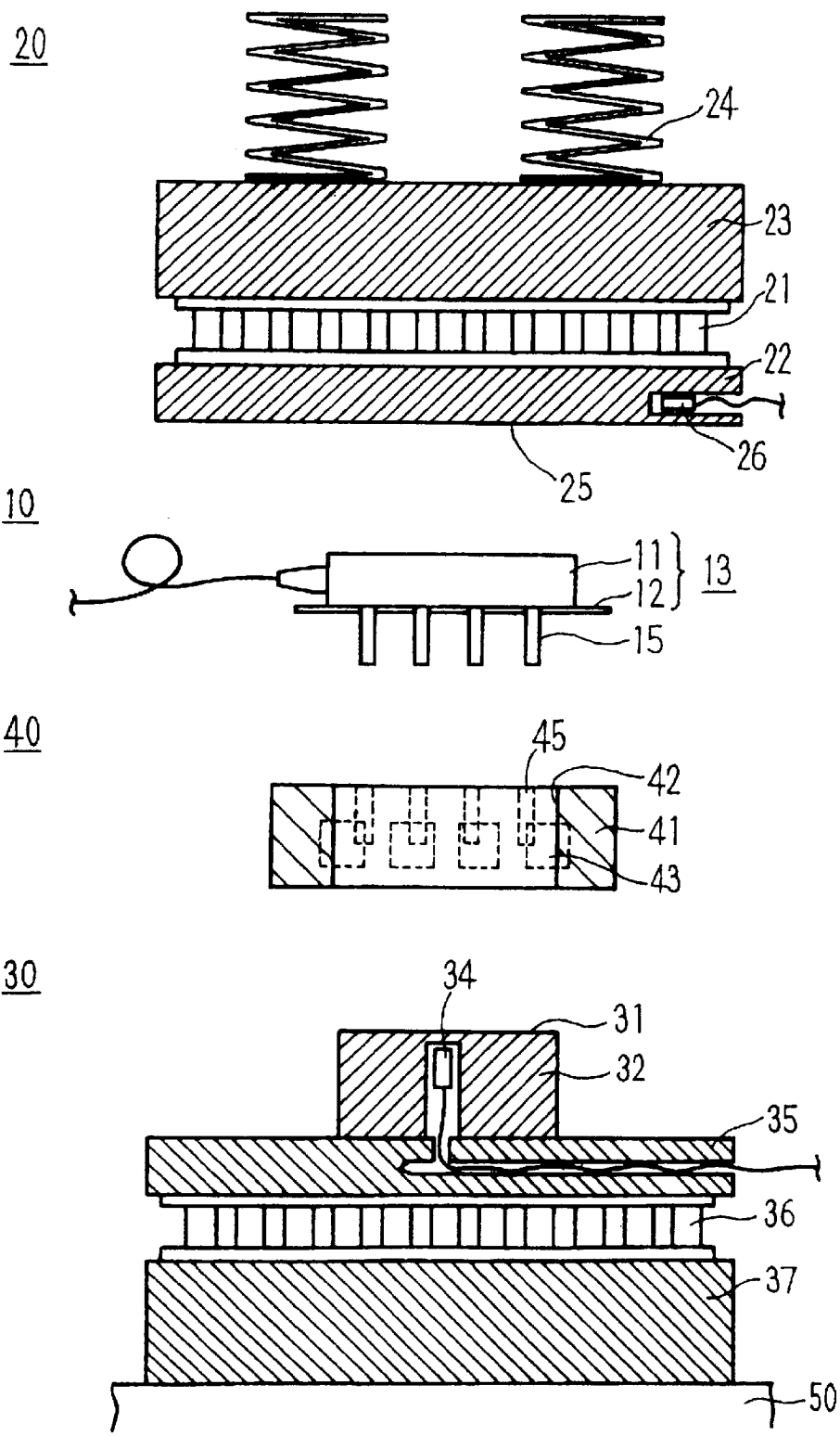
FIG. 5 is a sectional view of an assembly of a second embodiment of the present invention.

A temperature controlling device of the second embodiment of the present invention relates to a device including temperature regulators at the upper and lower supporting units. FIG. 5 is a sectional view of the assembly of the second embodiment, showing the structure of the temperature controlling device.

Referring to FIG. 5, the socket and the semiconductor module used in the embodiment are similar to the above-described socket and semiconductor module used in the first embodiment.

Referring to FIG. 5, a lower supporting unit 30 used in the embodiment differs from the lower supporting unit (the supporting unit 30 shown in FIGS. 2 and 3) used in the above-described first embodiment in the following ways. First, a heat insulating section 33 for shielding a head section 32 is not provided. Therefore, heat exchange between the head section 32 and the unit support 35 cannot be prevented. Rather, in this embodiment, it is preferable to make the difference between the temperatures of the head section 32 and the unit support 35 small by forming the unit support 35 using a material which conducts heat well. Second, a temperature regulator 36 that can change the temperature of a supporting unit 30 is provided. The temperature regulator 36 comprises, for example, a Peltier element, and is provided in close contact with the bottom surface of the unit support 35. In addition, a heat exchanger 37 for processing waste heat of the temperature regulator 36 is provided below the temperature regulator 36. The other structural features, including the structural features that a heat transfer surface 31 is formed as the top surface of the head section 32 fitted through a through hole 42 of a socket 40, and that a temperature sensor 34 for measuring the temperature of the head section 32 is provided, are the same as those of the lower supporting unit 30 used in the first embodiment.

The upper supporting unit 20 used in the embodiment is the same as the upper supporting unit 20 used in the first embodiment except that a temperature sensor 26 for measuring the temperature of an temperature equalizing block 22 is provided.

The above-described temperature controlling device of the second embodiment of the present invention has two methods of use. Hereunder, referring to FIG. 5, the procedure for controlling the temperature of the semiconductor module 10 after the semiconductor module 10 has been interposed between the upper and the lower supporting units 20 and 30 will be described.

In the first method of use, as in the first embodiment, the temperature regulator 21 of the upper supporting unit 20 is controlled so that the temperature of the head section 32 is maintained at a predetermined temperature. First, electrical power to the temperature regulator 36 of the lower supporting unit 31 is controlled in order to maintain the temperature of the head section 32 measured at the temperature sensor 34 at a temperature (for example, within a certain temperature range of from 24° C. to 26° C.) close to the predetermined temperature (such as 25° C.). After the temperature of the head section 32 has become steady, the electrical power to the temperature regulator 36 is fixed at this value. Instead of fixing the electrical power, it is possible to measure the temperature of the top surface of the temperature regulator 36 or the temperature of the unit support 35 in order to control the electrical power so that the temperature is constant. By this, the effects of changes in the environmental temperature of the device, such as to room temperature, on the controlling of the temperature of the head section 32 can be reduced.

Then, electrical power is supplied to the temperature regulator 21 of the upper supporting unit 20 in order to control the temperature of the temperature equalizing block 22 so that the temperature of the head section 32 is equal to the predetermined temperature. When the temperature of the head section 32 has reached the predetermined temperature, electrical and optical tests of the semiconductor module 10 are started.

In this method of use, since the difference between the temperatures of the unit support 35 and the head section 32 is small, the amount of heat flowing into and out of the head section 32 is small. Therefore, the difference between the temperatures of the head section 32 and the semiconductor module 10 also becomes small, thereby making it possible to precisely control the semiconductor module 10 at its predetermined temperature value. In addition, it is possible to monitor the temperature of the temperature equalizing block 22 by the temperature sensor 26. In this case, it is possible to confirm that the temperature of the semiconductor module is controlled within a temperature range measured by the two temperature sensors 26 and 34 provided at the upper and lower supporting units 20 and 30, respectively.

In the second method of use, the temperature of the semiconductor module 10 is controlled at the predetermined temperature by maintaining the temperatures of the upper and lower supporting units 20 and 30 at different temperature values. In this method, the temperature regulator 21 of the upper supporting unit 20 is controlled in order to cause the temperature of the temperature equalizing block 22 measured by the temperature sensor 26 to be equal to a previously determined temperature value. On the other hand, the temperature regulator 36 of the lower supporting unit 30 is controlled in order to cause the temperature of the head section 32 measured by the temperature sensor 34 to be equal to a previously determined temperature that differs from that of the temperature equalizing block 22. For example, when the predetermined temperature of the semiconductor module 10 is 25° C., the temperature regulators 21 and 36 are controlled so that the temperature of the temperature equalizing block 22 is 26° C., and the temperature of the head section 32 is 24° C., respectively. At this time, when the difference between the temperatures of the temperature equalizing block 22 and the head section 32 is made large, the amount of heat flowing to the heat transfer surfaces 25 and 31 becomes large, so that the temperature controlling operation is more stably carried out. This temperature control is carried out separately for the upper and lower supporting units 20 and 30. For example, the temperature of the temperature equalizing block 22 is controlled by controlling the temperature regulator 21 of the upper supporting unit 20 by using an output from the temperature sensor 26 provided inside the temperature equalizing block 22. On the other hand, the temperature of the head section 32 is controlled by controlling the temperature regulator 36 of the lower supporting unit 30 by using an output from the temperature sensor 34 provided inside the head section 32.

In this second method of use, it is guaranteed that the temperature of the semiconductor module 10 is maintained within a temperature range intermediate between those of the temperature equalizing block 22 and the head section 32. When the heat resistance between the semiconductor module 10 and the temperature equalizing block 22 and between the semiconductor module 10 and the head section 32 or the ratio of the heat resistances of the component parts can be known, it is possible to calculate the exact temperature of the semiconductor module from the temperatures of the temperature equalizing block 22 and the head section 32. Therefore, it is possible to cause the temperature of the semiconductor module 10 to be exactly equal to the predetermined temperature, such as 25° C., specified in the test specification.

The heat resistance ratio can be experimentally obtained. For example, while the temperature of the semiconductor module 10 is maintained at a constant value in a thermal equilibrium state, the temperature of either one of the supporting units 20 and 30 is raised, while the temperature of either one of the other supporting units 20 and 30 is lowered. The heat resistance ratio is the ratio between the amount of temperature rise and the amount of temperature fall. Whether or not the temperature of the semiconductor module 10 is maintained at a constant value can be confirmed by directly observing the temperature of the semiconductor module 10 with a radiation thermometer or by observing that the optical properties of the semiconductor module 10, such as light intensity and wavelength, remain at constant values. When the temperature of the semiconductor module 10 is directly measured, the heat resistances are immediately obtained.

A temperature controlling device of a third embodiment of the present invention will be described by referring to the above-described temperature controlling device of the first embodiment of the present invention. Referring to FIGS. 2, 3, and 4, a first unit used in this embodiment is similar to the first supporting unit 20 used in the first embodiment, and includes an temperature equalizing block 22 at one surface of a temperature regulator 21 and a heat exchanger 23 at the other surface of the temperature regulator 21. A heat transfer surface 25 is formed at the temperature equalizing block 22, and comes into thermal contact with a semiconductor package 13 by being pushed by springs 24. Here, the temperature of the first unit is controlled so that the temperature of a particular portion of a semiconductor module 10 is equal to a predetermined temperature. Here, ordinarily, a portion, such as a heat-dissipating plate 12, suitable for temperature control of the semiconductor module 10 is selected as the particular portion. A second unit used in the embodiment may be any unit as long as the unit measures the surface temperature of a portion of the semiconductor module 10 other than the aforementioned particular portion, and is similar to the second supporting unit 30 used in the first embodiment. The second unit may be one not including the heat insulating section of the second supporting unit 30 used in the first embodiment. The second unit may be a unit for measuring the surface temperature of the aforementioned particular portion. In that case, the temperature of the first unit is controlled so that the temperature of the semiconductor module 10 measured by the second unit equals the predetermined temperature.

According to one embodiment of the present invention, since the amount of heat flowing into or out of an area which is brought into contact with the semiconductor module is made small by shielding portions near this area from heat, the difference between the temperatures of the semiconductor module and the temperature sensor or the temperature sensors becomes small, so that the temperature of the semiconductor module can be precisely controlled at the predetermined temperature value.

According to another embodiment of the invention, since the temperature of the semiconductor module is maintained at the predetermined temperature value by bringing the semiconductor module into contact with the heat transfer surfaces whose temperatures are controlled at different temperature values, it is possible to cause the temperature of the semiconductor module to be exactly equal to the predetermined temperature value.

Accordingly, according to the present invention, since the temperature of the semiconductor module can be precisely controlled, a precise temperature test can be conducted, which contributes to increasing the reliability of a semiconductor device.

What is claimed is:

1. A device for controlling a temperature of a semiconductor module, the device comprising:

a first supporting unit for supporting the semiconductor module by bringing a first heat transfer surface disposed on the first supporting unit into contact with a first portion of the semiconductor module;

a second supporting unit for supporting the semiconductor module by bringing a second heat transfer surface disposed on the second supporting unit into contact with a second portion of the semiconductor module;

a temperature sensor for measuring a temperature of the second supporting unit;

a heat insulating section for shielding an area of the second supporting unit, the area including the second heat transfer surface and the temperature sensor, from heat transmitted from portions other than the second heat transfer surface; and a first temperature regulator for raising and lowering a temperature of the first supporting unit, wherein the first temperature regulator is controlled in order to maintain the temperature measured by the temperature sensor at a predetermined temperature.

2. A device for controlling a temperature of a semiconductor module, the device comprising:

a first supporting unit for supporting the semiconductor module by bringing a first heat transfer surface disposed on the first supporting unit into contact with a first portion of the semiconductor module;

a second supporting unit for supporting the semiconductor module by bringing a second heat transfer surface disposed on the second supporting unit into contact with a second portion of the semiconductor module;

a temperature sensor for measuring a temperature of the second supporting unit;

a first temperature regulator for raising and lowering a temperature of the first supporting unit; and a second temperature regulator for raising and lowering the temperature of the second supporting unit, wherein the first temperature regulator is controlled in order to maintain the temperature measured by the temperature sensor at a predetermined temperature.

3. A device for controlling a temperature of a semiconductor module, the device comprising:

a first supporting unit, whose temperature is controlled at a first predetermined temperature, for supporting the semiconductor module by bringing a first heat transfer surface disposed on the first supporting unit into contact with a first portion of the semiconductor module; and a second supporting unit, whose temperature is controlled at a second predetermined temperature which is different from the first predetermined temperature, for supporting the semiconductor module by bringing a second heat transfer surface disposed on the second supporting unit into contact with a second portion of the semiconductor module.

4. A device for controlling a temperature of a semiconductor module according to either claim 1 or claim 3, wherein the first and second supporting units sandwich the semiconductor module between the first and second heat transfer surfaces that oppose each other.

5. A device for controlling a temperature of a semiconductor module according to either claim 1 or claim 3, wherein either one of the first supporting unit and the second supporting unit comprises a head section, which is formed into a protrusion provided thereon, having the heat transfer surface at an end of the head section and fitting through a through hole formed in a socket to which the semiconductor module is mounted.

6. A device for controlling a temperature of a semiconductor module according to either claim 1 or claim 3, wherein the semiconductor module is an optical module containing an optical semiconductor element therein.

7. A device for controlling a temperature of a semiconductor module according to either claim 1 or claim 3, wherein the temperature of the semiconductor module, which is provided as a test sample used on an environmental temperature test, is controlled to a test temperature.

8. A device for controlling a temperature of a semiconductor module according to any one of claims 1 to 3, wherein the temperature of at least one of the first supporting unit and the second supporting unit is raised and lowered by a Peltier element.

9. A method of controlling a temperature of a semiconductor module, the method comprising the steps of:

bringing a first portion of the semiconductor module into contact with a first heat transfer surface disposed on a first supporting unit, whose temperature is controlled at a first predetermined temperature; and bringing a second portion of the semiconductor module into contact with a second heat transfer surface disposed on a second supporting unit, whose temperature is controlled at a second predetermined temperature, which is different from the first predetermined temperature.

10. A method of controlling a temperature of a semiconductor module according to claim 9, wherein the semiconductor module is an optical module containing a semiconductor element therein.

11. A method of controlling a temperature of a semiconductor module according to claim 9, the method comprising another step of:

controlling the temperature of the semiconductor module at a predetermined temperature being between the first predetermined temperature and the second predetermined temperature.

12. A method of controlling a temperature of a semiconductor module according to claim 11, wherein the semiconductor module is an optical module containing a semiconductor element therein.

* * * * *